United States Patent [19]
Ghaneei

[11] Patent Number: 5,260,893
[45] Date of Patent: Nov. 9, 1993

[54] CORE MEMORY WIRE GUIDE AND SUPPORT AND UTILIZATION METHOD

[75] Inventor: Mahmoud Ghaneei, Huntsville, Ala.

[73] Assignee: SCI Systems, Inc.

[21] Appl. No.: 816,301

[22] Filed: Dec. 27, 1991

[51] Int. Cl.$^5$ ............................................. G11C 11/00
[52] U.S. Cl. ...................................... 365/130; 29/604
[58] Field of Search ..................... 365/130, 59; 29/604, 29/737

[56] References Cited

U.S. PATENT DOCUMENTS

| | | | |
|---|---|---|---|
| 3,218,694 | 11/1965 | Wood | 29/604 |
| 3,465,308 | 9/1969 | Sasaki | 29/604 |
| 3,694,913 | 10/1972 | Dvaving | 29/604 |
| 3,818,464 | 6/1974 | Becker | 365/130 |

Primary Examiner—Eugene R. LaRoche
Assistant Examiner—A. Zarabian
Attorney, Agent, or Firm—Gregor N. Neff

[57] ABSTRACT

Strips of fabric material are attached along the edges of an array of magnetic cores on a substrate with the strips having an upstanding ridge aligned parallel to the edges of the array. The material of the fabric serves as a guide for threading wires through the cores, and also serves as an attachment support for the wires to keep them from lifting free from the support after being inserted through the cores. The guide/supports are relatively simple, strong, durable, resistant to deterioration, and provide an inexpensive guide and support for the wires of the core memory.

12 Claims, 2 Drawing Sheets

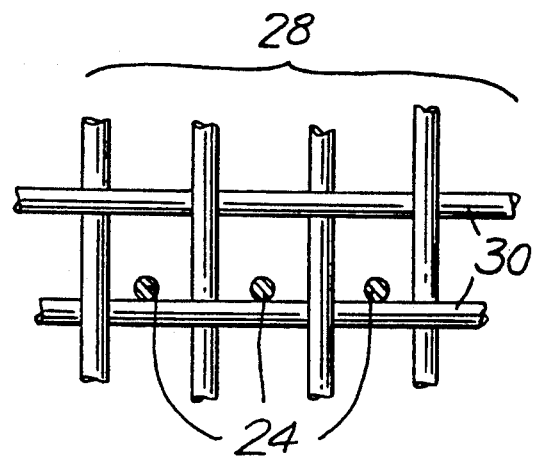
FIG. 3
FIG. 4
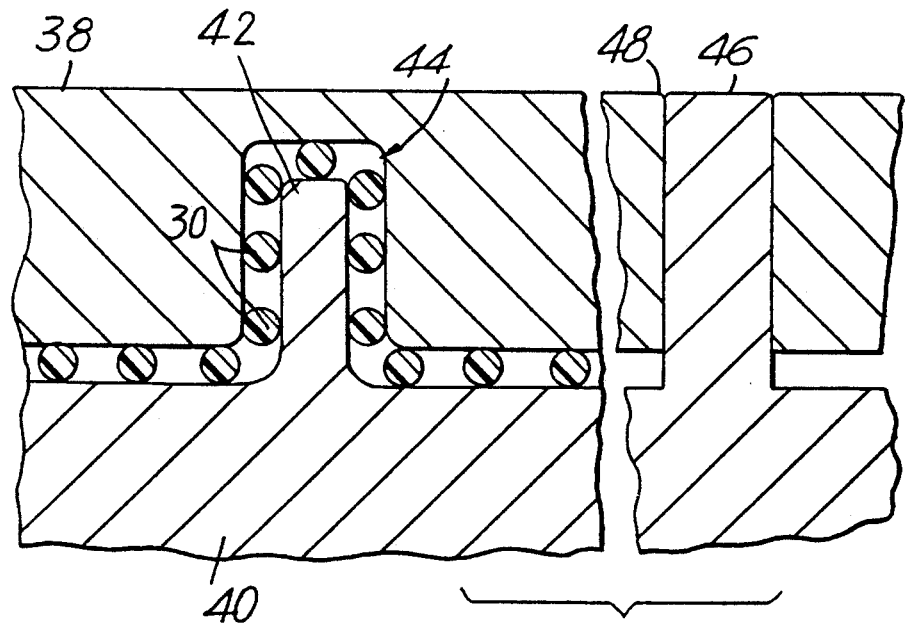

CORE MEMORY WIRE GUIDE AND SUPPORT AND UTILIZATION METHOD

This invention relates to guide and support devices for the wires of magnetic core memories and similar electronic assemblies, and to methods utilizing such devices for fabricating magnetic core memories and the like.

Magnetic core memories usually are required to be as small and compact as possible. Thus, the toroidal magnetic cores tend to be very small, and the wires passing through the cores have a very small diameter. For example, in a typical core memory, 256 lead wires are packed into a distance of only 1.75 inches. Each of the 256 wires must be threaded through one row or column of the tiny cores. This makes it very difficult to thread the wires through the cores.

Automated machinery has been proposed and used for threading the wires through the tiny cores, but the current volume of manufacturing does not warrant the capital expenditures for such complex and precise machinery. Therefore, it is still practical and common for such core memories to be assembled by hand.

In the hand assembly of a core memory, the typical prior technique is to create a core memory mat, which consists of an array of a very large number of magnetic cores arranged in rows and columns adhering to an adhesive material on the surface of a support structure. Then, wire guides are fastened in place along the edges of the array, and very fine wires attached to long needles are inserted through holes in the wire guides and through the center holes in the magnetic cores. The wire guides help to guide the needles into the holes, and also serve to hold the wires down and keep them from lifting up after insertion and during the application of terminal structures to the wires.

One of the problems with prior wires guides is that they are difficult and expensive to make. One typical prior wire guide, for example, is made by molding plastic around a plurality of thin wires laid side-by-side, with precise spacing relative to one another. After the molded plastic material has hardened, the wires are removed from the holes, leaving holes of very small diameter through which the wires may be threaded.

This is a very painstaking, time-consuming, difficult and costly process. Moreover, the spacing of the wires provided by the holes is fixed and is not easily adaptable to different sizes of cores.

Accordingly, it is an object of the present invention to provide a guide and support structure for wires in magnetic core memories, and a method for using same, which is relatively easy to use, sturdy, and inexpensive to manufacture.

It is another object of the invention to provide a magnetic core mat and memory structure using the guide and support structure.

In accordance with the present invention, the foregoing objectives are met by the provision of a guide made from a strip of fabric having opening of a size satisfactory to serve to guide wires through the magnetic cores of a magnetic core array.

It is preferred that the fabric material have a fold or a raised ridge to stiffen the guide structure and serve as the guide portion of the structure.

The mesh size of the fabric preferably is substantially larger than the diameter of the wire to be threaded through the material, but small enough to ensure that there is at least one opening for every row or column of cores. The fabric preferably has woven threads which are secured to one another. The wire guide is attached to the surface of the core memory support with an adhesive. This attachment, and the short height of the ridge in the fabric makes it relatively strong and rigid. Two layers of material in the ridge add to the strength of the support.

Preferably, the ridge in the material is formed by a pair of forms while heating the material. A nylon material is selected for the fabric, and the nylon material is heated to a temperature just below its softening point in order to form permanent creases in the material.

The foregoing and other objects and advantages of the invention will be set forth in or apparent from the following description and drawings. In the drawings:

FIG. 3 is an enlarged view of a section of the fabric used in FIGS. 1 and 2, with wires inserted through openings in the fabric; and FIG. 4 is a cross-sectional view of a pair of forms used to form the upstanding ridge in the fabric of the strips used as guides in FIGS. 1 and 2.

CORE MEMORY STRUCTURE

Figure 1:
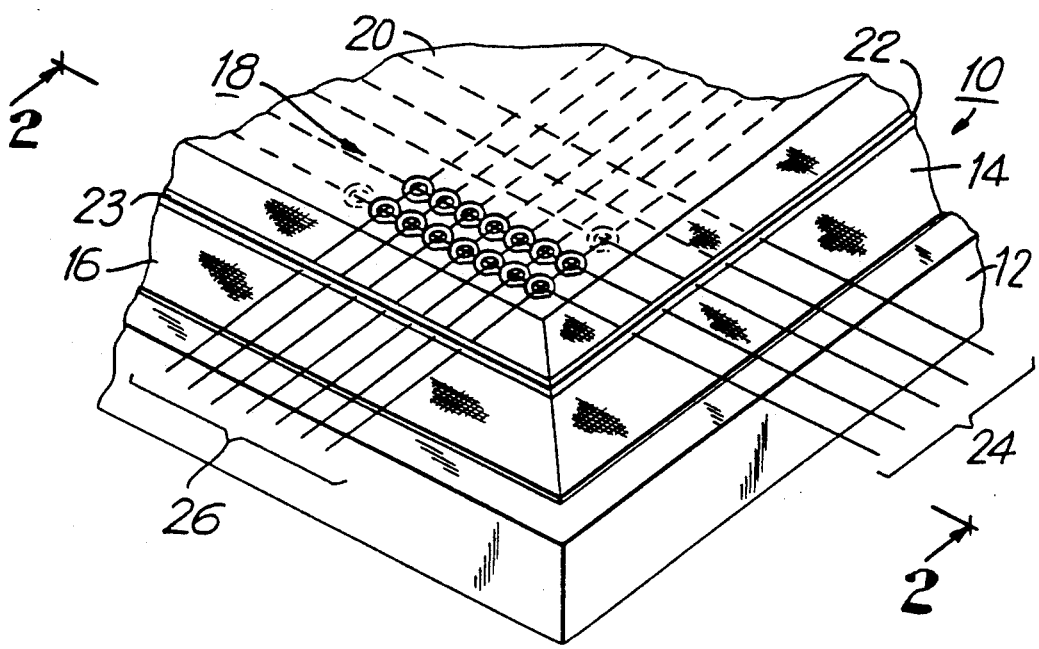
FIG. 1 is an enlarged perspective view, partially broken-away and partially schematic, of a magnetic core memory made in accordance with the present invention.

FIG. 1 shows a magnetic core memory 10 constructed in accordance with the present invention. The memory 10 includes a substrate, usually with a conductive metal surface of copper or aluminum. Attached to the upper surface of the substrate 12 is a mat consisting of a support panel 20 to which magnetic cores are attached. The cores are arranged in rows and columns, in a rectangular or square array 18, with each core being aligned at an angle of approximately 45° with respect to the sides of the substrate 12. The panel 20 is fastened to the surface of the substrate 12 by means of an adhesive layer 19 (see FIG. 2).

Also secured to the substrate 12 along the edges of the array 18 are strips 14 and 16 of fabric which are secured by adhesive to the surface of the substrate. Similar strips are secured along all sides of the array. Each strip 14 has an upstanding ridge 22 or 23 which extends upwardly from two horizontal portions of the strip which are attached to the surface of the substrate 12.

If the panel 20 were large enough to cover the whole surface of the substrate 12, the fabric would be attached to the panel.

Two sets of wires 24 and 26 are threaded through the central openings in the toroidal magnetic cores 18. The wires 24 and 26 extend in directions perpendicular to one another.

The actual array 18 of cores is not shown in its entirety in order to simplify the drawings. Moreover, the cores are shown separated by much greater distances than actually are used in practice. Furthermore, only a few cores and a few wires are shown in order to illustrate the principal of the invention. Actually, as it will be readily understood by one skilled in the art, the core array may include hundreds or thousands of magnetic cores, and a similarly large number of wires.

Some of the wires are used as sense wires, some are used as x wires, some are used as y wires. As is it well known in the art, up to four or more wires can pass through each core.

Figure 2:
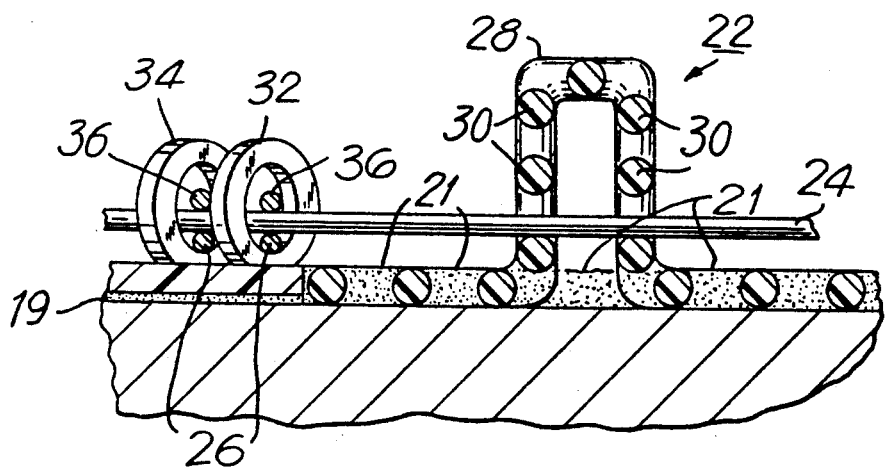
FIG. 2 is a cross-sectional, partially broken-away and partially schematic view taken along line 2—2 of FIG. 1.

FIG. 2 is a cross-sectional view taken along line 2—2 of FIG. 1 which is broken away and enlarged for the purposes of clarity. FIG. 2 shows the layer of adhesive 19 and the panel 20 in which the individual toroids 32 and 34, for example, are secured.

As is shown in FIG. 3 as well as FIG. 2, the fabric of which the strips 14 and 16 are made consist of crossed warp threads 30 and weft threads 28, which are secured to one another at their crossing points. The preferred material is a nylon material.

The openings in the fabric preferably are substantially larger than the diameter of the wires 24 passing through the holes, as it is shown in FIG. 3, as well as in FIG. 2. By this means, a relatively large range of different wire sizes can be guided by means of a strip of fabric having a given opening size.

FABRICATION METHOD

The wire guides of the present invention are used as follows:

First, an array of magnetic cores is formed by loading cores onto a form with many slots forming recesses to position the cores, and hold them in a square or rectangular array of rows and columns of cores, each aligned at an angle of 45° with respect to the sides of the square or rectangular array.

Next, the panel 20 is formed of a flexible adhesive-coated material called "Keene tape" and is pressed onto the top of the core array so that the adhesive adheres to the cores, and the form is turned upside down and removed, thus leaving the array of cores attached to the panel 20. The assembly then is baked for about 24 hours to firmly adhere the cores to the panel, thus forming a "mat".

Then, the strips 14 and 16 are secured to the substrate along the edges of the core array by means of an adhesive. As it is shown in FIG. 2, the adhesive 21 fills the holes in the fabric and helps to stiffen the ridge.

Next, the wires 24 and 26, each attached to a relatively long needle of approximately the same diameter of the wire, are threaded through the holes in the fabric ridge 22 or 23, and through a single row or column of toroidal cores to complete the core structure.

As it is shown in FIG. 2, there can be more than two wires threaded through each magnetic core. In FIG. 2, the wires 26 pass through the cores in a direction perpendicular to the direction of the wires 24. Additional wires 36 pass through the cores in the same direction as the wires 26. Up to four or more wires can be threaded through each core by this means.

When the adhesive 21 holding the strips 14 and 16 in place is completely cured, the relatively short height of the upstanding ridge 22 and the strength of the nylon material used, as well as the adhesive 21, make the ridge 22 into a strong anchoring structure to hold the wires in position and prevent them from lifting off of the board.

Of course, the fabric of the strips 14 and 16 is made of insulating material so as to avoid shorting-circuitry the wires relative to one another.

STRIP FABRICATION

FIG. 4 is a cross-sectional view of a form used to make the strips 14 and 16. The lower member 40 of the form has an elongated ridge 42 which is of the appropriate thickness and height to fit into a groove 44 in the upper member 38 of the form. The lower member 40 has a pair of locating pins 46 which fit into a precisely located hole 48 in the upper part 38 so as to locate the ridge 42 accurately within the groove 44.

The nylon strip is fitted between the two parts of the form, and the two halves of the form are pressed together, thus forming the material into the upstanding ridge 22.

Subsequently, the forms are heated to a temperature slightly less than the softening temperature of the material. This is about 340° F., with the specific material used. The forms are held at that temperature for approximately two minutes, or for a different length of time sufficient to form a permanent crease in the material without softening or deforming the nylon fibers.

MATERIALS

The material of which the fabric for the strips 14 and 16 is made preferably is a precision woven fabric made of polyamide 66 having the following specification:

| | |
|---|---|
| Mesh opening: | 125 microns |
| Mesh count: | |
| Warp: | 123.9/inch |
| Weft: | 137.2/inch |
| Open area: | 41.25% |
| Thickness of fabric: | 135 microns |
| Density: | 40 g/m$^2$ |

Suitable material meeting the foregoing specifications is sold by a number of companies, one of which is Tetko, Inc. 333 South Highland Avenue, Briarcliff Manor, N.Y. 10510.

The warp and weft fibers of this material are bonded together and do not slip relative to one another, thus maintaining the size of the openings during use.

A guide made of the above material had the following dimensions; the height from bottom surface to the top of the ridge: 0.025 inch. total width: 0.08 inch. Width of ridge: 0.014 inch. Thickness of material: 0.005 inch.

The preferred adhesive material used to adhere the fabric strips to the substrate is called "RTV", which is believed to stand for a Room Temperature Vulcanizing adhesive. Such an adhesive also is used to adhere the panel 20 to the substrate. Such an adhesive is sold by a number of companies, including General Electric Company.

The materials used are selected so they will readily pass military standards tests such as those in which chemical solvents are applied to the structure. The solvents typically include isopropyl alcohol, Freon, and the like. The completed core memories must stand up to temperatures ranging from negative 40° C. to plus 85° C. The adhesive RTV and the other materials described above more than meet these requirements.

Although nylon is preferred as a fiber for the fabrics, fibers made of other thermo plastic resins such as polyester, and similar materials, also can be used.

The magnetic cores are standard toroids of different sizes. Typical cores have an inside diameter of 10 mils and an outside diameter of 13 mils. The diameter of the wires varies but tends to be within the range from 2 to 3.5 mils.

It is preferred that the mesh size in the fabric be selected so that there is at least one opening per row or column of cores of the smallest core size contemplated.

The device and methods amply meet the objectives set forth above. The fabric strips are simple and relatively inexpensive to make, are durable, resistant to environmental and solvent damage, and provide a strong anchoring structure.

One of the further advantages of the invention is that the size of the openings and the alignment of the openings in the fabric need not be matched precisely to the openings in a particular row or column of cores. In fact, it causes no particular problems to have two or more mesh openings usable for each row or column of cores. Either one of which can be used for needle and wires. Enough space is left between the ridge 22 or 23 and the nearest edge of the core array so that some flexibility in this regard is permitted.

This invention can be practiced in many different forms other than the specific forms described above. Those specific forms are described in order to set forth the best mode presently contemplated for carrying out the invention. However, the protection of this patent shall not be limited to those forms and should be interpreted to cover other core memory wire guides and support utilization methods utilizing the spirit and contribution of the invention.

I claim:

1. A magnetic core memory mat for making a magnetic core memory, said mat comprising, in combination, a support panel, a plurality of magnetic cores adhered to the surface of said panel and arranged in parallel linear arrays, and wire guide means comprising at least one fabric strip adjacent to said panel at one or more boundaries of said arrays of cores, said strip being stiffened to provide a means for holding wires threaded through said strip and said cores.

2. A device as in claim 1, in which said cores have openings, and said fabric strip is stiffened by forming a relatively short, upstanding ridge having holes through which said wires can be inserted to thread them through said openings in said cores.

3. A magnetic core memory comprising, in combination, a substrate, an array of magnetic cores mounted on said substrate and arranged in parallel linear arrays, and wire guide means comprising at least one fabric strip mounted on said substrate at one or more boundaries of said arrays of cores, said strip being stiffened to provide a means for holding wires threaded through said strip and said cores.

4. A device as in claim 3 in which said fabric strip has an elongated upstanding ridge, said wires passing through said ridge.

5. A device as in claim 4 including one of said strips secured, along each edge of the array of magnetic cores.

6. A device as in claim 4 in which the material of said strip is polyamide, with a RTV adhesive securing said strip to said substrate.

7. A method of fabricating a magnetic core memory, said method comprising the steps of:
   (a) providing a mat consisting of a panel, a plurality of magnetic cores arrayed on said panel, and stiffened fabric strips at the edges of the array of cores, said fabric having a predetermined mesh size, and
   (b) threading wires through said strips and through said cores.

8. A method as in claim 7 in which the size of the opening in said fabric is sufficient to allow said wires to be passed therethrough.

9. A method of fabricating a magnetic core memory mat, said method comprising the steps of:
   (a) providing a panel with an array of magnetic cores secured thereto; and
   (b) mounting at least one stiffened fabric strip adjacent said array at its edges to serve as wire threading guides.

10. A method as in claim 9 including the step of forming said stiffened fabric strip by bending an elongated flat strip of fabric longitudinally to form a bent edge with at least one adjacent border area, and attaching said border area adjacent said array to hold said bent edge in guide-forming relationship to said array.

11. A method as in claim 10 in which said bending step comprises offsetting a portion of said fabric intermediate its lateral edges to form said fabric into a channel-shaped member with an upstanding ridge and two side flanges, and said attaching step comprises adhering said panel and said fabric flanges to a substrate with said ridge bordering the edges of said array.

12. A method as in claim 11 in which the material of said fabric is heat-formable, and said offsetting step is accompanied by heating said material to a temperature near its softening temperature and holding it at that temperature for a time sufficient to permanently crease said material.

* * * * *